(12) United States Patent
Stave

(10) Patent No.: US 12,051,478 B2
(45) Date of Patent: Jul. 30, 2024

(54) TEST DEVICES HAVING PARALLEL IMPEDANCES TO REDUCE MEASUREMENT INPUT IMPEDANCE AND RELATED APPARATUSES, SYSTEMS, AND METHODS

(71) Applicant: Micron Technology, Inc., Boise, ID (US)

(72) Inventor: Eric J. Stave, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 720 days.

(21) Appl. No.: 17/131,383

(22) Filed: Dec. 22, 2020

(65) Prior Publication Data
US 2022/0199193 A1 Jun. 23, 2022

(51) Int. Cl.
*G06F 11/00* (2006.01)
*G11C 29/50* (2006.01)

(52) U.S. Cl.
CPC .. *G11C 29/50004* (2013.01); *G11C 29/50008* (2013.01); *G11C 2029/5004* (2013.01)

(58) Field of Classification Search
CPC .............. G06F 11/2273; G06F 11/263; G06F 11/3664; G06F 11/2268; G06F 11/221; G06F 11/273; G06F 11/2733
See application file for complete search history.

(56) References Cited

U.S. PATENT DOCUMENTS

| | | | |
|---|---|---|---|
| 6,480,978 B1 * | 11/2002 | Roy | G01R 31/3193 714/724 |
| 2017/0336469 A1 * | 11/2017 | Lamesch | G01R 27/2605 |
| 2018/0180652 A1 * | 6/2018 | Sestok, IV | G01R 27/14 |

* cited by examiner

*Primary Examiner* — Charles Ehne
(74) *Attorney, Agent, or Firm* — TraskBritt

(57) ABSTRACT

Systems, apparatuses, and methods for test devices having parallel impedances to reduce measurement input impedance are disclosed. An apparatus includes a test input terminal, a measurement output terminal, a reference voltage potential node, and a parallel resistor. The test input terminal is configured to electrically connect to a signal output terminal of a signal generator. The test input terminal is configured to receive a test signal from the signal generator via the signal output terminal. The measurement output terminal electrically connects to a measurement input terminal of an electrical measurement instrument. The parallel resistor is electrically connected from the measurement output terminal to the reference voltage potential node. A system includes the apparatus and the electrical measurement instrument. A method includes providing a test signal to the test device, verifying the test signal using the electrical measurement instrument, and providing the test signal to a device under test.

20 Claims, 6 Drawing Sheets

TEST DEVICES HAVING PARALLEL IMPEDANCES TO REDUCE MEASUREMENT INPUT IMPEDANCE AND RELATED APPARATUSES, SYSTEMS, AND METHODS

TECHNICAL FIELD

This disclosure relates generally to test devices having parallel impedances to reduce input impedance of test devices and effective measurement input impedances of electrical measurement instruments, and more specifically to a test device for use with an electrical measurement instrument to verify a test signal to be provided to a device under test (DUT).

BACKGROUND

In some instances it may be desirable to verify a test signal to be provided to a DUT before providing the test signal to the DUT. For example, a signal generator may be used to generate the test signal, and an electrical measurement instrument may be used to verify the test signal before providing the test signal to the DUT.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
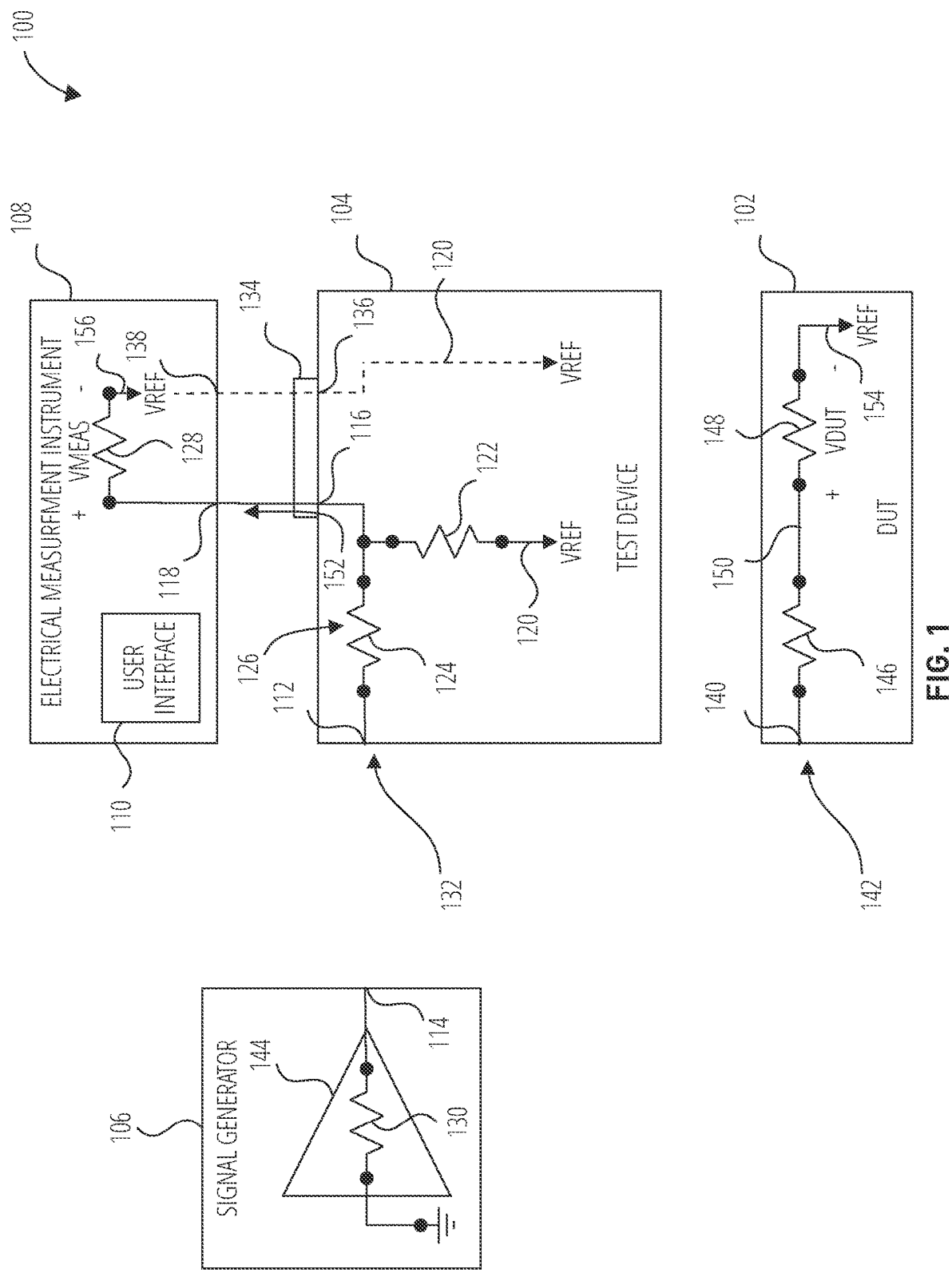
FIG. 1 is circuit schematic illustration of a system for testing a DUT, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the term "terminal" refers to a connection node of an electronic device. For example, a "terminal" may refer to an electrically conductive pin, an electrically conductive pad, an electrically conductive trace, or other electrically conductive structure configured to conduct electrical signals to and/or from an electronic device.

A test device may serve to electrically connect a signal generator (e.g., a bit error ratio tester (BERT)) to an electrical measurement instrument (e.g., an oscilloscope) to verify a test signal prior to providing the test signal to a DUT (e.g., a dual inline memory module (DIMM)). As a specific, non-limiting example, a test signal that may be used for a stressed eye test may be provided, by a BERT, to an oscilloscope via a DIMM test device to verify the test signal prior to providing the test signal to the DIMM. Since a BERT may be relatively sensitive and precise instrument, the BERT may not function appropriately or may even be damaged if an input impedance of the DIMM test device is not substantially the same as a DUT input impedance expected for the DIMM. Also, if impedances and voltage potentials of the test device when electrically connected to the electrical measurement instrument do not mimic those of the DIMM, the electrical measurement instrument may not see the same electrical signals as will be provided to circuitry of the DIMM (e.g., the oscilloscope may see electrical signals that have different offsets as compared to those that will be provided to the circuitry of the DIMM).

The DIMM may include a dampening resistor between a DUT input terminal and DIMM circuitry that will ultimately receive the electrical signal during a test of the DIMM. Accordingly, the DIMM may have a DUT input impedance that is substantially a series combination of an electrical resistance of the dampening resistor and a DIMM circuitry impedance of the DIMM circuitry. Unfortunately, a measurement input impedance of an oscilloscope itself may be greater than DIMM circuitry impedance of the DIMM circuitry, and in fact may be on the same order as the total DUT input impedance (e.g., about fifty ohms (50Ω)). Accordingly, an input impedance looking into the DIMM test device, which may include a series combination of test device circuitry (e.g., a dampening resistor to mimic the dampening resistor at the DUT input terminal of the DIMM) with the measurement input impedance of the oscilloscope, may be greater than the DUT input impedance of the DIMM, amounting to an input impedance mismatch between the test device and the DIMM. This mismatch of the input impedance of the DIMM test device with the DUT input impedance of the DIMM may cause the BERT to malfunction or be damaged while attempting to verify the test signal using the DIMM test device and the oscilloscope. Moreover, the mismatch between the measurement input impedance of the oscilloscope and the DIMM circuitry impedance may result in different electrical signals being delivered to the oscilloscope and the DIMM circuitry, even responsive to the same test signal being delivered to the DIMM test device and the DIMM, respectively.

Embodiments disclosed herein reduce an effective measurement input impedance looking into a measurement input terminal of an electrical measurement instrument, and by extension reduce an input impedance of a test device that electrically connects a signal generator to the electrical measurement instrument to enable verification of a test signal to be provided to a DUT. Embodiments disclosed herein may use a parallel resistor in parallel with a measurement output terminal electrically connected to the electrical measurement instrument to reduce the effective measurement input impedance of the electrical measurement instrument and the input impedance of the test device to substantially the same as a DUT circuitry impedance and a DUT input impedance, respectively, of the DUT.

In some embodiments a DIMM test device includes one or more channels, each channel of the one or more channels including a dampening resistor in series with a parallel combination of a parallel resistor and a connector (e.g., a mini-SMP connector) for electrically connecting the DIMM test device to an oscilloscope. Accordingly, embodiments disclosed herein enable verification of a test signal from a BERT for a stressed eye test of a DIMM.

In some embodiments an apparatus includes a test input terminal, a measurement output terminal, a reference voltage potential node, and a parallel resistor. The test input terminal is configured to electrically connect to a signal output terminal of a signal generator. The test input terminal is configured to receive a test signal from the signal generator via the signal output terminal. The measurement output terminal is configured to electrically connect to a measurement input terminal of an electrical measurement instrument. The parallel resistor is electrically connected from the measurement output terminal to the reference voltage potential node to reduce an effective measurement input impedance looking into the measurement input terminal of the electrical measurement instrument.

In some embodiments a system includes a DUT and a test device. The DUT includes a DUT input terminal, DUT circuitry, and a dampening resistor electrically connected between the DUT input terminal and the DUT circuitry. The DUT input terminal has a DUT input impedance looking into the DUT input terminal. The test device includes a test input terminal having an input impedance substantially equal to the DUT input impedance. The test device also includes a measurement output terminal to electrically connect to a measurement input terminal of an electrical measurement instrument. The test device further includes a parallel resistor electrically connected in parallel with the electrical measurement instrument when the measurement input terminal of the electrical measurement instrument is electrically connected to the measurement output terminal of the test device. The parallel resistor is selected to reduce an effective input impedance of the electrical measurement instrument to substantially equal to a DUT circuitry impedance of the DUT circuitry.

In some embodiments a method of testing a DIMM includes electrically connecting a measurement input terminal of an electrical measurement instrument to a measurement output terminal of a DIMM test device. The DIMM test device includes a parallel resistor electrically connected from the measurement output terminal to a reference voltage potential node to reduce an effective measurement input impedance of the electrical measurement instrument. The method also includes electrically connecting a signal output terminal of a signal generator to a test input terminal of the DIMM test device, and providing a test signal from the signal output terminal of the signal generator to the test input terminal of the DIMM test device. The method further includes verifying the test signal using the electrical measurement instrument, electrically disconnecting the signal output terminal of the signal generator from the test input terminal of the DIMM test device, and electrically connecting the signal output terminal of the signal generator to an input terminal of the DIMM. In addition, the method includes providing the test signal from the signal output terminal of the signal generator to the input terminal of the DIMM, and testing operation of the DIMM responsive to the test signal.

FIG. 1 is a circuit schematic illustration of a system 100 for testing a DUT 102, according to some embodiments. The system 100 includes a DUT 102, a test device 104, a signal generator 106, and an electrical measurement instrument 108. The DUT 102 may include an electronic device that is to be tested. By way of non-limiting example, the DUT 102 may include a DIMM that is to undergo a stressed eye test. The DUT 102 includes a DUT input terminal 140, a DUT intermediate node 150, a DUT reference voltage potential node 154 (e.g., to receive a reference voltage potential VREF), DUT circuitry (not shown) having a DUT circuitry impedance 148 electrically connected between the DUT intermediate node 150 and the reference voltage potential node 154, and a dampening resistor 146 electrically connected between the DUT input terminal 140 and the DUT intermediate node 150.

The signal generator 106 is configured to provide a test signal to the DUT 102 as part of the test of the DUT 102. By way of non-limiting example, the signal generator 106 may include a driver 144 having a signal output impedance 130. Responsive to the test signal provided to the DUT, a DUT signal VDUT may be applied across the DUT circuitry impedance 148. The electrical measurement instrument 108 is configured to indirectly measure and verify the DUT signal VDUT expected responsive to the test signal from the signal generator 106 before the test signal is provided to the DUT 102. The test device 104 is configured to deliver the test signal from the signal generator 106 to the electrical measurement instrument 108 to enable the electrical measurement instrument 108 to measure and verify DUT signal VDUT.

The DUT input terminal 140 is configured to electrically connect to a signal output terminal 114 of the signal generator 106 and receive the test signal from the signal output terminal 114 of the signal generator 106. The DUT input terminal 140 has a DUT input impedance 142 looking into the DUT input terminal 140. Similarly, the test device 104 includes test input terminal 112 to electrically connect to the signal output terminal 114 of the signal generator 106 and receive the test signal from the signal output terminal 114 of the signal generator 106. The test input terminal 112 has an input impedance 132 looking into the test input terminal 112. The input impedance 132 is substantially equal to the DUT input impedance 142. Accordingly, the signal generator 106 will see substantially the same input impedance regardless of whether the signal output terminal 114 of the signal generator 106 is electrically connected to the DUT input terminal 140 of the DUT 102 or the test input terminal 112 of the test device 104. By way of non-limiting example, the DUT input impedance 142 and the input impedance 132 may each be substantially fifty ohms (50Ω). The signal output terminal 114 of the signal generator 106 is configured to selectively electrically connect to the DUT input terminal 140 of the DUT 102 and the test input terminal 112 of the test device 104. Accordingly, the signal generator 106 is configured to selectively provide a test signal to the DUT input terminal 140 and the test input terminal 112.

The test device 104 includes a measurement output terminal 116 to electrically connect to a measurement input terminal 118 of the electrical measurement instrument 108. In some embodiments the test device 104 also includes a reference voltage potential terminal 136 to electrically connect to a reference voltage potential input terminal 138 of the electrical measurement instrument 108. The reference voltage potential terminal 136 is electrically connected to the reference voltage potential node 120. The electrical measurement instrument 108 has a measurement input impedance 128 looking into the measurement input terminal 118 (i.e., when disconnected from the measurement output terminal 116). By way of non-limiting example, the measurement input impedance 128 may be substantially fifty ohms (50Ω). Accordingly, the measurement input impedance 128 may greater than the DUT circuitry impedance 148, and may be on the same order (e.g., substantially the same) as the DUT input impedance 142.

The test device 104 also includes circuitry 126 electrically connected between the test input terminal 112 and the measurement output terminal 116. By way of non-limiting example, the circuitry 126 may include a dampening resistor 124. The test device 104 further includes a parallel resistor 122 electrically connected from the measurement output terminal 116 to the reference voltage potential node 120 of the test device 104. By way of non-limiting example, the reference voltage potential node 120 may be configured to receive a reference voltage potential (e.g., 1.1 volts to emulate a power supply voltage potential of a DIMM). By way of non-limiting example, the reference voltage potential node 120 may be electrically connected to a programmable termination voltage potential of VREF. The reference voltage potential VREF provided to the reference voltage potential node 120 may be substantially the same as the reference voltage potential VREF provided to the reference voltage potential node 154 of the DUT 102. The reference voltage potential node 120 (and the reference voltage potential node 154 of the DUT 102), however, may be electrically connected to a ground node, a power supply node, or any other reference voltage potential node. With the parallel resistor 122 electrically connected from the measurement output terminal 116 to the reference voltage potential node 120, the parallel resistor 122 may be electrically connected in parallel with the measurement input impedance 128 of the electrical measurement instrument 108. Accordingly, the input impedance 132 looking into the test input terminal 112 is substantially the impedance of the circuitry 126 (e.g., the electrical resistance of the dampening resistor 124) in series with the parallel combination of the measurement input impedance 128 with the parallel resistor 122. The parallel resistor 122 may be selected to reduce the input impedance 132 to be substantially equal to the DUT input impedance 142. Also, the parallel resistor 122 may be selected to reduce an effective measurement input impedance 152 looking into the measurement input terminal 118 of the electrical measurement instrument 108 (i.e., with the measurement input terminal 118 electrically connected to the measurement output terminal 116) to be substantially equal to the DUT circuitry impedance 148 of the DUT 102.

Absent the parallel resistor 122, the input impedance 132 looking into the test input terminal 112 would be substantially the circuitry 126 (e.g., the electrical resistance of the dampening resistor 124) in series with the measurement input impedance 128 of the electrical measurement instrument 108. Assuming that the measurement input impedance 128 of the electrical measurement instrument 108 is roughly the same as the DUT input impedance 142 of the DUT 102, the series combination of the dampening resistor 124 and the measurement input impedance 128 would result in an input impedance 132 that is greater than the DUT input impedance 142 by substantially the electrical resistance of the circuitry 126 (e.g., the electrical resistance of the dampening resistor 124). By way of non-limiting example, the DUT input impedance 142 of a DIMM as the DUT 102, may be substantially 50Ω, the measurement input impedance 128 of an oscilloscope as the electrical measurement instrument 108 the electrical measurement instrument 108 may be substantially 50Ω, and an electrical resistance of the dampening resistor 124 may be substantially 15Ω. As a result, absent the parallel resistor 122, the input impedance 132 looking into the test input terminal 112 with the electrical measurement instrument 108 electrically connected to the test device 104 would be substantially 65Ω. Assuming that a BERT as the signal generator 106 is designed to provide the test signal to the DIMM as the DUT 102, which has a DUT input impedance 142 of substantially 50Ω, the 65Ω input impedance 132 of the test device 104, absent the parallel resistor 122, may cause malfunction of or damage to the signal generator 106 when the signal generator 106 provides the test signal to the test device 104.

Also, absent the parallel resistor 122, the effective measurement input impedance 152 looking into the measurement input terminal 118 of the electrical measurement instrument 108 would be greater than the DUT circuitry impedance 148 (e.g., the effective measurement input impedance 152 may be substantially 50Ω and the DUT circuitry impedance 148 may be substantially 35Ω). As a result of the mismatch between the effective measurement input impedance 152 and the DUT circuitry impedance 148, a measurement signal VMEAS across the measurement input impedance 128 may be different from the DUT signal VDUT. Accordingly, the electrical measurement instrument 108 may not measure substantially the same signal as the DUT signal VDUT that will be applied to the DUT circuitry impedance 148 responsive to the test signal.

Inclusion of the parallel resistor 122, however, decreases the input impedance 132 of the test device 104 as compared to what the input impedance 132 of the test device 104 would be absent the parallel resistor 122. As previously discussed, assuming that the dampening resistor 124 has an electrical resistance of substantially 15Ω and the measurement input impedance 128 is substantially 50Ω, the input impedance 132 of the test device 104 would be substantially 65Ω (15 Ω+50Ω) absent the parallel resistor 122. Inclusion of the parallel resistor 122 and assuming an electrical resistance of 120Ω of the parallel resistor 122, the input impedance 132 of the test device 104 is substantially 50Ω (15Ω of the dampening resistor 124 in series with the parallel combination of 50Ω of the measurement input impedance 128 of the electrical measurement instrument 108 with the 120Ω of the parallel resistor 122, or in other words 15 Ω+50 Ω//120 Ω~50Ω). Accordingly, inclusion of the parallel resistor 122 enables the input impedance 132 to be substantially the same as the DUT input impedance 142 of the DUT 102 even where the sum of the electrical resistance of the dampening resistor 124 and the measurement input impedance 128 (e.g., a real component of the measurement input impedance 128) of the electrical measurement instrument 108 is greater than the DUT input impedance 142 of the DUT 102.

Also, inclusion of the parallel resistor 122 decreases the effective measurement input impedance 152 to be substantially the same as the DUT circuitry impedance 148. Accordingly, assuming that the electrical resistance of the dampening resistor 124 is substantially the same as the electrical resistance of the dampening resistor 146, the measurement signal VMEAS measured by the electrical measurement instrument 108 is substantially the same as the DUT signal VDUT at the DUT circuitry impedance 148. By way of non-limiting example, dampening resistor 124 and the dampening resistor 146 may have electrical resistances of substantially 15Ω, and the effective measurement input impedance 152 and the DUT circuitry impedance 148 may be substantially 35Ω (e.g., the parallel combination of a 120Ω parallel resistor 122 and a 50Ω measurement input impedance is substantially 35Ω).

In some embodiments the electrical measurement instrument 108 includes a user interface 110. By way of non-limiting example, the electrical measurement instrument 108 may include an oscilloscope and the user interface 110 may include an electronic display configured to display a waveform of the test signal provided by the signal generator 106. The user interface 110 may also include one or more buttons, one or more dials, one or more sliders, a touch screen interface, an audio output device for providing audible alerts, other input/output devices, or combinations thereof, to enable a user to utilize the electrical measurement instrument 108 to verify the test signal.

In some embodiments the input impedance 132 looking into the test input terminal 112 is substantially equal to a signal output impedance 130 looking into the signal output terminal 114 of the signal generator 106. In such embodiments the input impedance 132 of the test device 104 may match the signal output impedance 130 of the signal generator 106.

In some embodiments the effective measurement input impedance 152 is substantially the same as the DUT circuitry impedance 148. In such embodiments the measurement signal VMEAS measured by the electrical measurement instrument 108 is substantially the same as the DUT signal VDUT.

In some embodiments the test device 104 includes an electrical connector 134 configured to detachably electrically connect the measurement output terminal 116 and the reference voltage potential terminal 136 of the test device 104 to the measurement input terminal 518 and the reference voltage potential input terminal 138, respectively, of the electrical measurement instrument 108. By way of non-limiting example, the electrical connector 134 may include a sub miniature push-on (SMP) connector. As a result, the test device 104 may be configured to electrically connect to the electrical measurement instrument 108 without an intervening high impedance probe.

In some embodiments the electrical measurement instrument may include its own measurement reference voltage potential node 156 configured to receive the reference voltage potential VREF (i.e., substantially the same reference voltage potential VREF at the reference voltage potential nodes 120 and 154). In such embodiments the electrical measurement instrument may not include the reference voltage potential input terminal 138 and the test device 104 may not include the reference voltage potential terminal 136.

It is noted that the signal output impedance 130 of the signal generator 106, the measurement input impedance 128 of the electrical measurement instrument 108, and the DUT circuitry impedance 148 of the DUT 102 are depicted in FIG. 1 as resistors that are electrically connected between terminals and/or nodes (e.g., the signal output terminal 114, the measurement input terminal 118, the DUT intermidate node 150, the reference voltage potential nodes 120, 154, 156, and the DUT input terminal 140, a ground terminal, etc.). The signal output impedance 130, the measurement input impedance 128, and the DUT circuitry impedance 148, however, are merely small signal equivalent circuit models of actual circuitry of the signal generator 106, the electrical measurement instrument 108, and the DUT circuitry, and should not be interpreted as representing the actual circuitry of the signal generator 106, the electrical measurement instrument 108, and the DUT circuitry.

Figure 2:
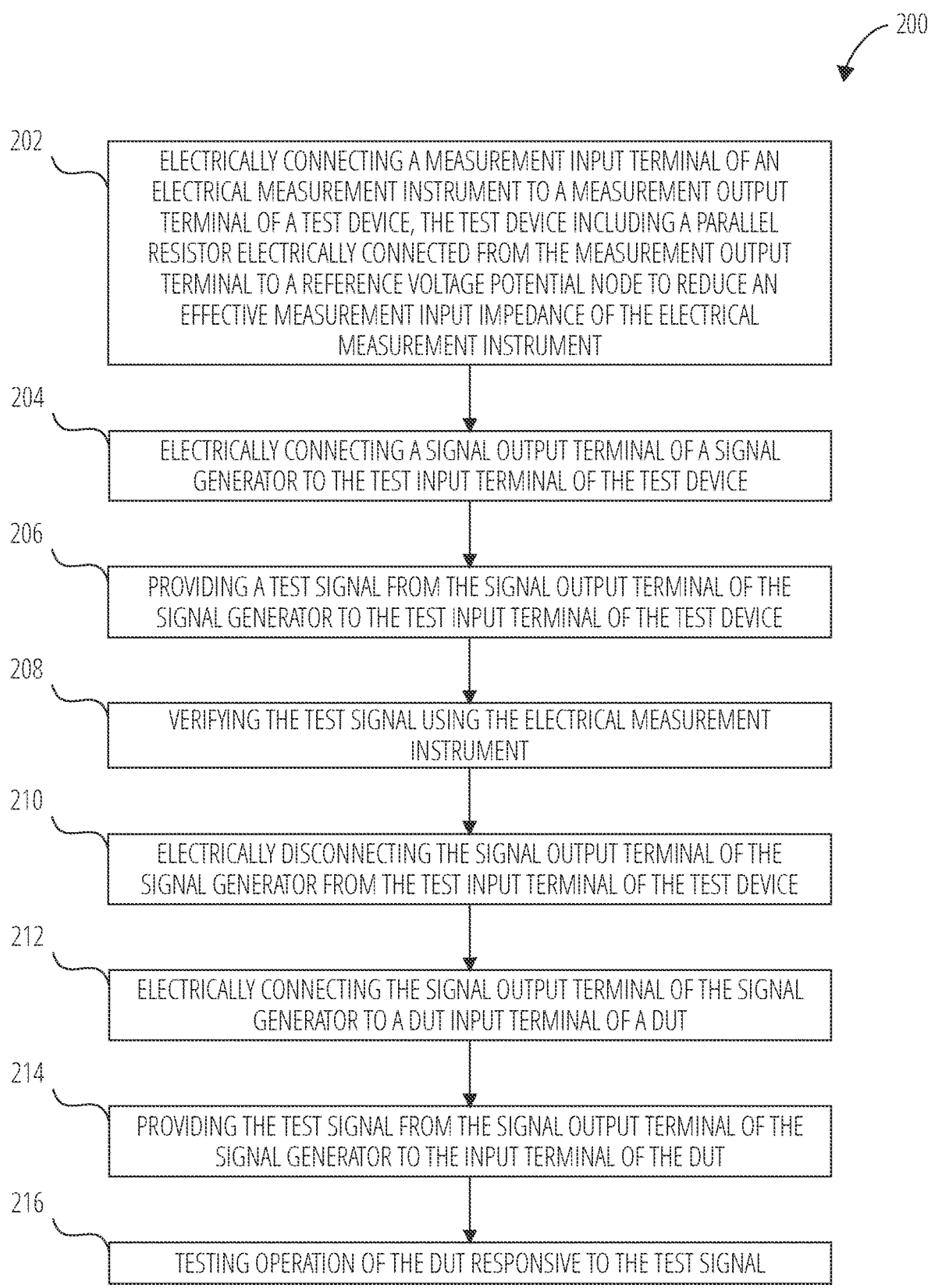
FIG. 2 is a flowchart illustrating a method of testing the DUT of FIG. 1, according to some embodiments.

FIG. 2 is a flowchart illustrating a method 200 of testing the DUT 102 of FIG. 1, according to some embodiments. Referring to FIG. 1 and FIG. 2 together, at operation 202 the method 200 includes electrically connecting the measurement input terminal 118 of the electrical measurement instrument 108 to the measurement output terminal 116 of the test device 104 (e.g., a DIMM test device). As previously discussed, the test device 104 includes a parallel resistor 122 electrically connected from the measurement output terminal 116 to a reference voltage potential node 120 to reduce the effective measurement input impedance 152 of the electrical measurement instrument. As a result, the input impedance 132 may be substantially equal to the DUT input impedance 142 of the DUT 102, and the effective measurement input impedance 152 may be substantially equal to the DUT circuitry impedance 148. In some embodiments, electrically connecting the measurement input terminal 118 of the electrical measurement instrument 108 to the measurement output terminal 116 of the test device 104 includes electrically connecting an oscilloscope (e.g., oscilloscope 508 of FIG. 5) to a measurement output terminal (e.g., the measurement output terminal 516 of FIG. 5) of a DIMM test device (e.g., DIMM test device 504 of FIG. 5). In some embodiments electrically connecting the oscilloscope to the measurement output terminal of the DIMM test device includes directly electrically connecting the oscilloscope to the measurement output terminal of the DIMM test device without an intervening high impedance probe.

Figure 3:
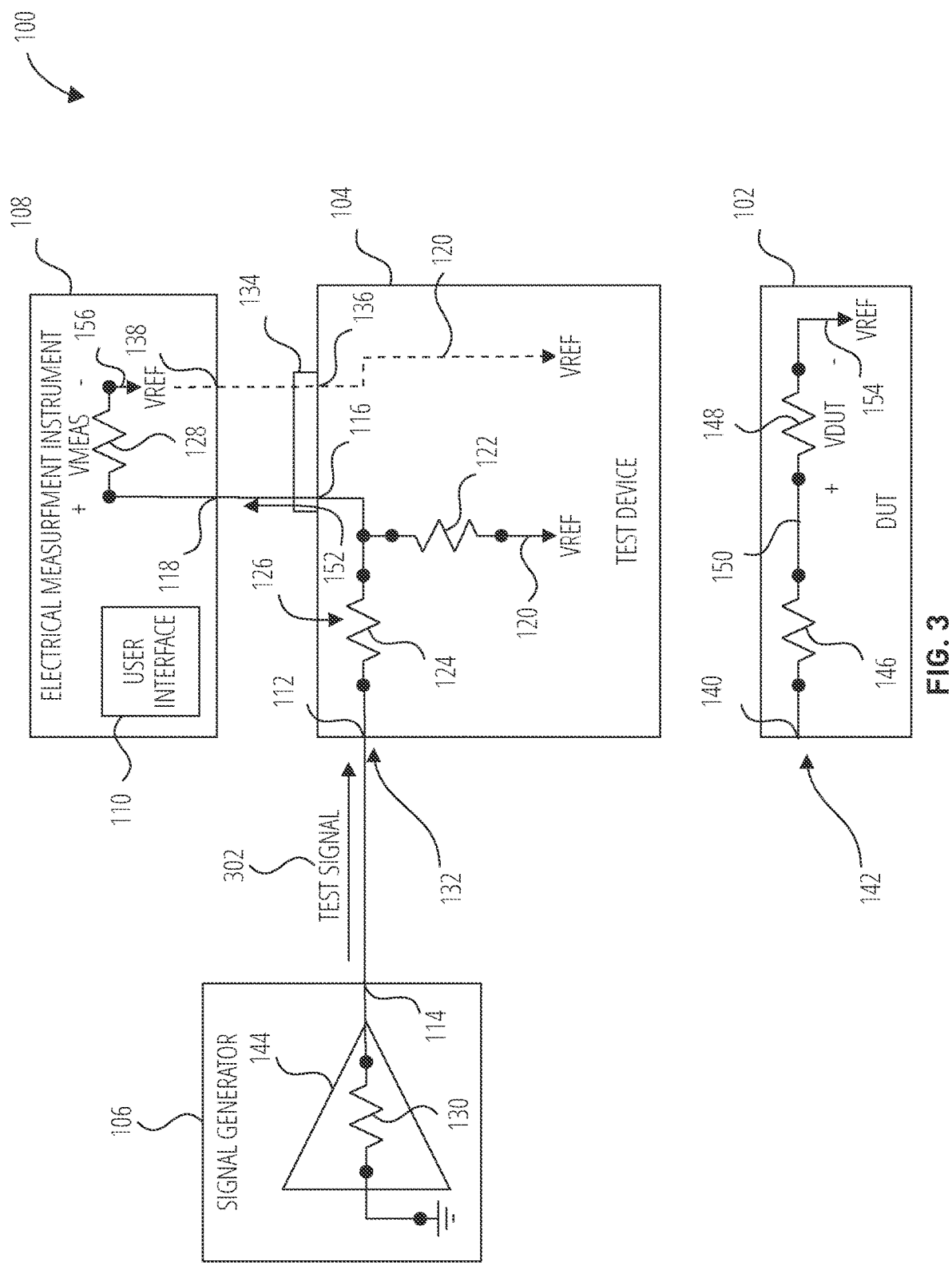
FIG. 3 is a circuit schematic illustration of the system of FIG. 1 with a signal generator electrically connected to a test device.

At operation 204 the method 200 includes electrically connecting the signal output terminal 114 of the signal generator 106 to the test input terminal 112 of the test device 104. FIG. 3 illustrates the signal output terminal 114 of the signal generator 106 electrically connected to the test input terminal 112 of the test device 104. In some embodiments, electrically connecting the signal output terminal 114 of the signal generator 106 to the test input terminal 112 of the test device 104 includes electrically connecting a BERT (e.g., BERT 506 of FIG. 5) to a test input terminal (e.g., test input terminal 512 of FIG. 5) of a DIMM test device (e.g., DIMM test device 504).

FIG. 3 is a circuit schematic illustration of the system 100 of FIG. 1 with a signal generator 106 electrically connected to a test device 104. Referring to FIG. 2 and FIG. 3 together, at operation 206 the method 200 includes providing a test signal 302 from the signal output terminal 114 of the signal generator 106 to the test input terminal 112 of the test device 104.

Figure 4:
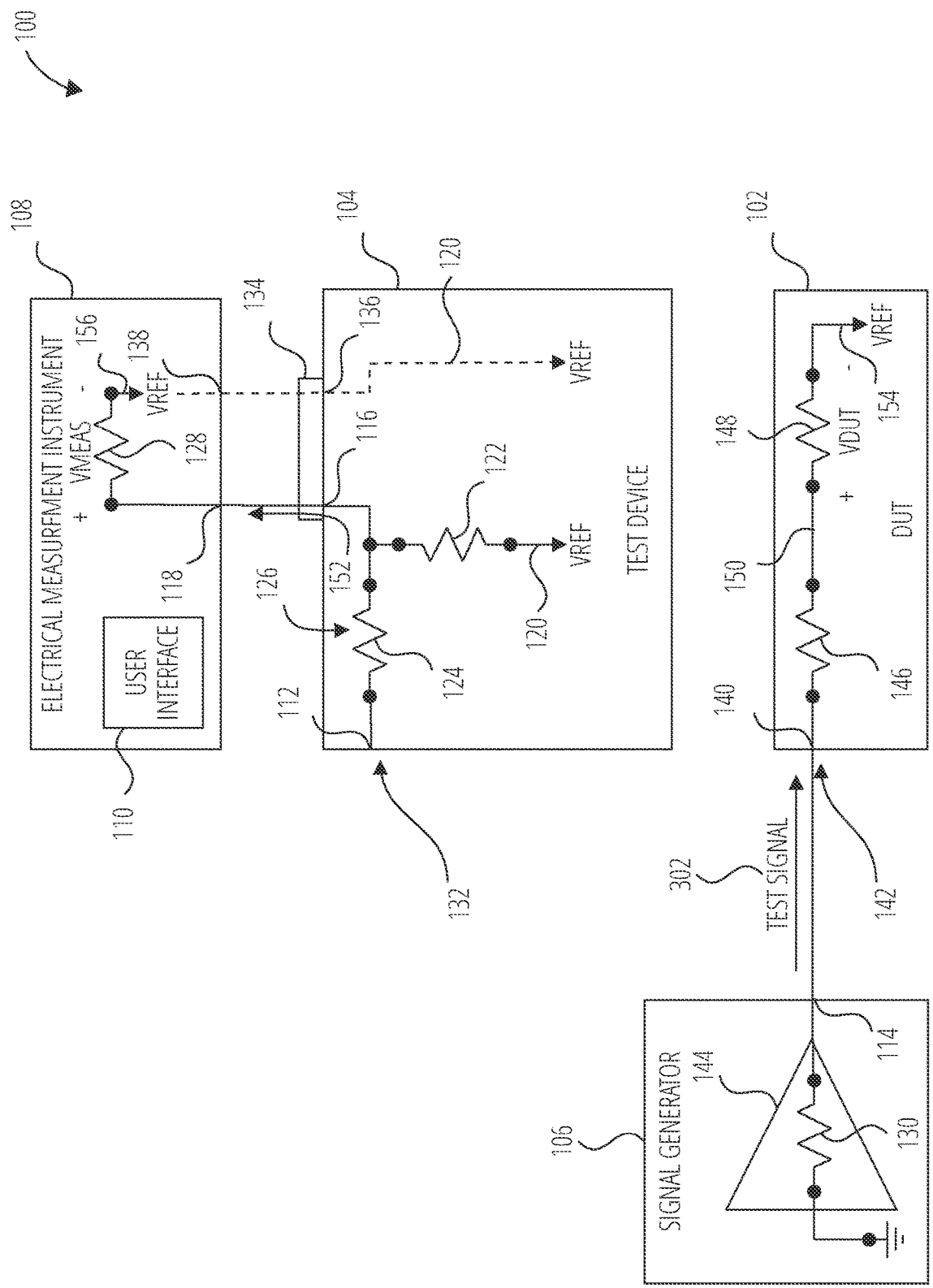
FIG. 4 is a circuit schematic illustration of the system of FIG. 1 with the signal generator electrically connected to the DUT.

At operation 208 the method 200 includes verifying the test signal 302 using the electrical measurement instrument 108. Verifying the test signal 302 may include measuring and verifying the measurement signal VMEAS, which is substantially the same as an expected DUT signal VDUT. At operation 210 the method 200 includes electrically disconnecting the signal output terminal 114 of the signal generator 106 from the test input terminal 112 of the test device 104. At operation 212 the method 200 includes electrically connecting the signal output terminal 114 of the signal generator 106 to a DUT input terminal 140 of the DIMM. FIG. 4 illustrates the signal output terminal 114 of the signal generator 106 electrically connected to the DUT input terminal 140 of the DUT 102.

FIG. 4 is a circuit schematic illustration of the system 100 of FIG. 1 with the signal generator 106 electrically connected to the DUT 102. Referring to FIG. 2 and FIG. 4 together, at operation 214 the method 200 includes providing the test signal 302 from the signal output terminal 114 of the signal generator 106 to the test input terminal of the DUT 102. At operation 216 the method 200 includes testing operation of the DUT 102 responsive to the test signal 302. By way of non-limiting example, testing operation of the DUT 102 may include performing a stressed eye test on a DIMM (e.g., DIMMs 502 of FIG. 5).

Figure 5:
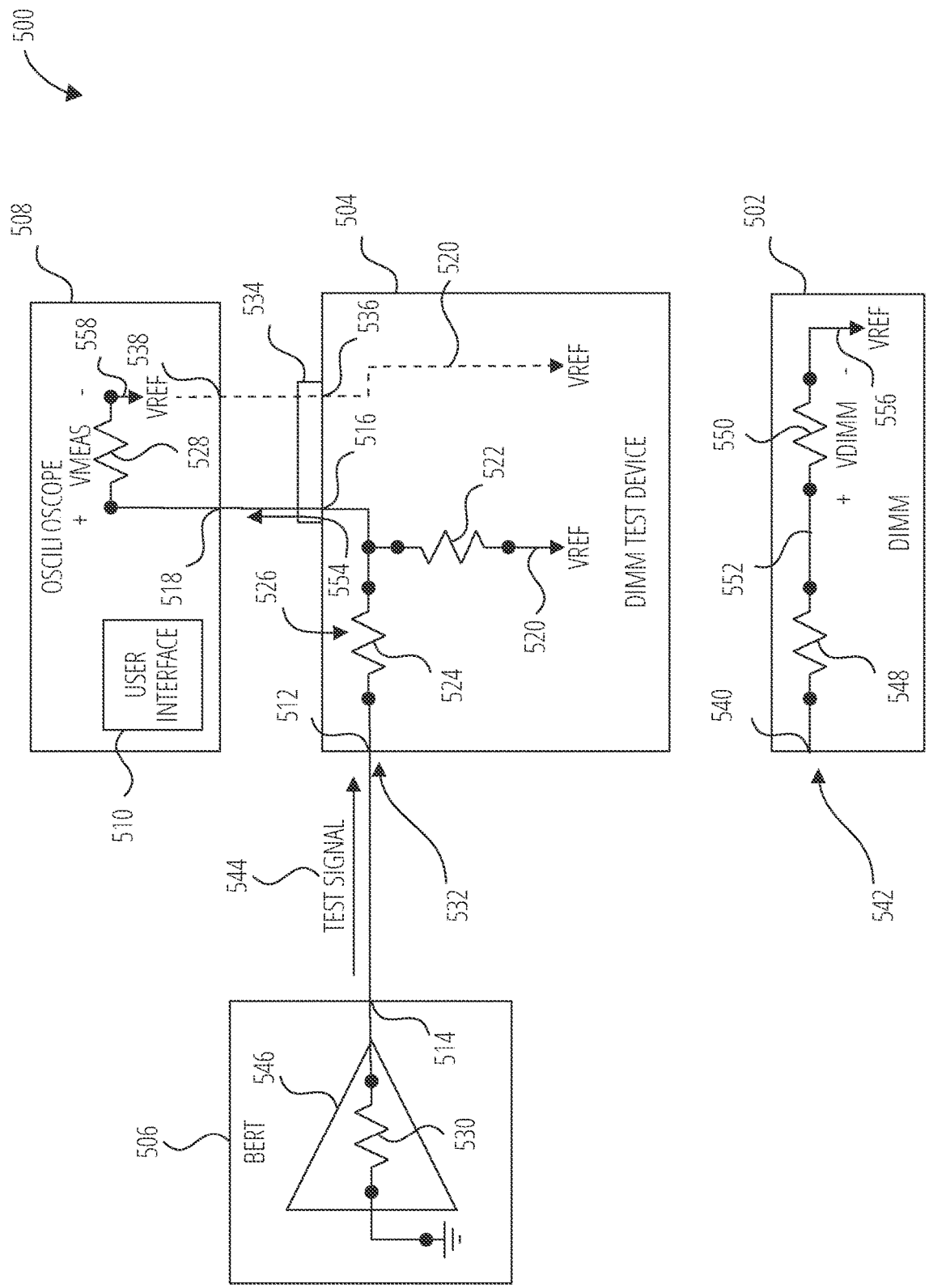
FIG. 5 is a circuit schematic illustration of a system for testing a DIMM, which is an example of the system of FIG. 1.

As previously discussed, in some embodiments the DUT 102 may include a DIMM, the test device 104 may include a DIMM test device, the signal generator 106 may include a BERT, and the electrical measurement instrument 108 may include an oscilloscope. FIG. 5 illustrates an example of such an embodiment.

FIG. 5 is a circuit schematic illustration of a system 500 for testing a DIMM 502, which is an example of the system 100 of FIG. 1. The system 500 includes the DIMM 502, a DIMM test device 504, a BERT 506, and an oscilloscope 508, which are similar to the DUT 102, the test device 104, the signal generator 106, and the electrical measurement instrument 108 discussed above with reference to FIG. 1, FIG. 3, and FIG. 4. For example, the DIMM 502 includes a DUT input terminal 540, a dampening resistor 548, DIMM circuitry having a DIMM circuitry impedance 550, a reference voltage potential node 556, and a DUT input impedance 542 looking into the DUT input terminal 540, which are similar to the DUT input terminal 140, the dampening resistor 146, the DUT circuitry having the DUT circuitry impedance 148, the reference voltage potential node 154, and the DUT input impedance 142 discussed with reference to FIG. 1, FIG. 3, and FIG. 4; the DIMM test device 504 includes a test input terminal 512, a measurement output terminal 516, a reference voltage potential terminal 536, an SMP connector 534, circuitry 526, a reference voltage potential node 520, a parallel resistor 522, and an input impedance 532 looking into the test input terminal 512, which are similar to the test input terminal 112, the measurement output terminal 116, the reference voltage potential terminal 136, the electrical connector 134, the circuitry 126, the reference voltage potential node 120, the parallel resistor 122, and the input impedance 132 discussed with reference to FIG. 1, FIG. 3, and FIG. 4; the BERT 506 includes a signal output terminal 514, a driver 546, and a signal output impedance 530 looking into the signal output terminal 514, which are similar to the signal output terminal 114, the driver 144, and the signal output impedance 130 discussed above with reference to FIG. 1, FIG. 3, and FIG. 4; and the oscilloscope 508 includes a user interface 510, a measurement input terminal 518, a reference voltage potential input terminal 538, a measurement input impedance 528 looking into the measurement input terminal 518, and an effective measurement input impedance 554 looking into the measurement input terminal 518, which are similar to the user interface 110, the measurement input terminal 118, the reference voltage potential input terminal 138, the measurement input impedance 128, and the effective measurement input impedance 152 discussed above with reference to FIG. 1, FIG. 3, and FIG. 4.

The BERT 506, the DIMM test device 504, and the oscilloscope 508 may be used to test the DIMM 502, similarly as discussed with reference to the method 200 of FIG. 2. For example, the BERT 506 may provide a test signal 544 to the DIMM test device 504 to enable the oscilloscope 508 to verify the test signal 544 (e.g., using the measurement signal VMEAS), or to enable a user of the system 500 to verify the test signal 544, before providing the test signal 544 to the DIMM 502 (e.g., resulting in application of a DIMM signal VDIMM to DIMM circuitry having a DIMM circuitry impedance 550). By way of non-limiting example, the test signal 544 may be a test signal for a stressed eye test.

Since the DIMM test device 504 includes the parallel resistor 522, the input impedance 532 looking into the test input terminal 512 of the DIMM test device 504 may be substantially equal to the DUT input impedance 542 looking into the DUT input terminal 540 of the DIMM 502. Accordingly, the BERT 506 may operate properly and avoid damage that might otherwise be caused (e.g., to a transceiver of the BERT 506) if the input impedance 532 looking into the test input terminal 512 were substantially different from the DUT input impedance 542 looking into the DUT input terminal 540. Also, the effective measurement input impedance 554 may be substantially equal to the DIMM circuitry impedance 550. Accordingly, the measurement signal VMEAS at the oscilloscope may be substantially the same as the DIMM signal VDIMM expected at the DIMM circuitry of the DIMM 502.

Figure 6:
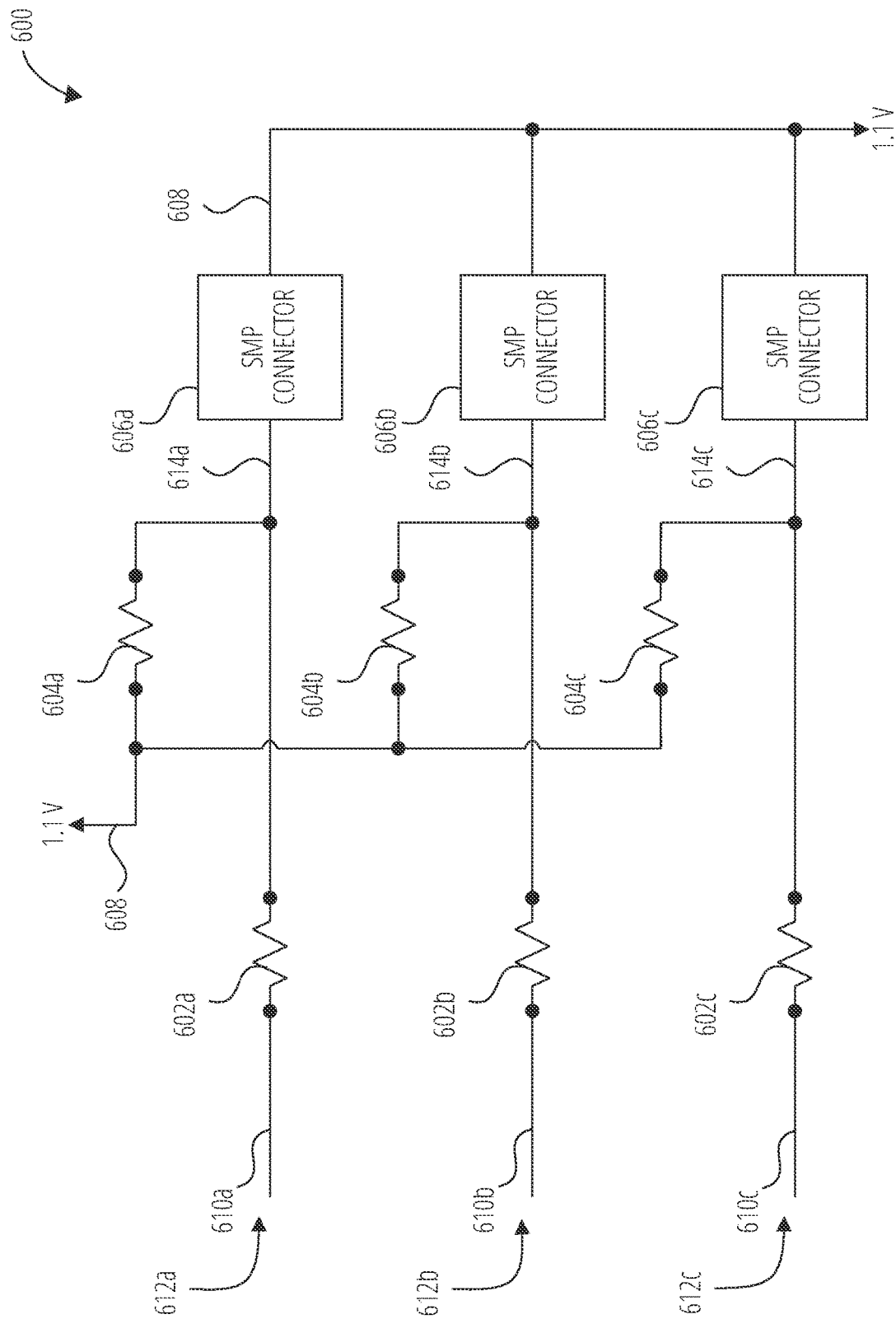
FIG. 6 is a schematic illustration of a DIMM test device, according to some embodiments.

FIG. 6 is a schematic illustration of a DIMM test device 600, according to some embodiments. The DIMM test device 600 is an example of a three-channel DIMM test device. The DIMM test device 600 includes test input terminals 610a-610c, each of which is configured to electrically connect to a signal output terminal of a signal generator (e.g., a signal output terminal 114 or 514 of the signal generator 106 or BERT 506 of FIG. 1 and FIG. 5, respectively). The DIMM test device 600 also includes dampening resistors 602a-602c and measurement output terminals 614a-614c. The dampening resistors 602a are electrically connected from the respective one of the test input terminals 610a-610c to the respective one of the measurement output terminals 614a-614c (i.e., the dampening resistor 602a is electrically connected from the test input terminal 610a to the measurement output terminal 614a, the dampening resistor 602c is electrically connected from the test input terminal 610b to the measurement output terminal 614b, and the dampening resistor 602c is electrically connected from the test input terminal 610c to the measurement output terminal 614c).

The DIMM test device 600 further includes a reference voltage potential node 608 and SMP connectors 606a-606c electrically connected between their respective measurement output terminals 614a-614c and the reference voltage potential node 608 (i.e., the SMP connector 606a is electrically connected between the measurement output terminal 614a and the reference voltage potential node 608), the SMP connector 606b is electrically connected between the measurement output terminal 614a and the reference voltage potential node 608, and the SMP connector 606c is electrically connected between the measurement output terminal 614c and the reference voltage potential node 608. By way of non-limiting example, a reference voltage potential of substantially 1.1 volts may be provided (e.g., the reference voltage potential may be a programmable termination voltage potential) to the reference voltage potential node 608 to emulate conditions that may be expected on a DIMM. Each of the SMP connectors 606a-606c is configured to electrically connect to an electrical measurement instrument (e.g., the electrical measurement instrument 108 of FIG. 1, the oscilloscope 508 of FIG. 5). By way of non-limiting example, an electrical measurement instrument may include multiple input channels, and two or more of the SMP connectors 606a-606c may simultaneously be electrically connected to the electrical measurement instrument to verify multiple test signals.

The DIMM test device 600 also includes parallel resistors 604a-604c. The parallel resistors 604a-604c are electrically connected from their respective measurement output terminals 614a-614c to the reference voltage potential node 608 (i.e., the parallel resistor 604a is electrically connected from the measurement output terminal 614a to the reference voltage potential node 608, the parallel resistor 604b is electrically connected from the measurement output terminal 614b to the reference voltage potential node 608, and the parallel resistor 604c is electrically connected from the measurement output terminal 614c to the reference voltage potential node 608). Accordingly, the parallel resistors 604a-604c are electrically connected in parallel with measurement input impedances of one or more electrical measurement instruments electrically connected to the SMP connectors 606a-606c, reducing corresponding effective measurement input impedances and input impedances 612a-612c.

By way of non-limiting example, the measurement input impedances of the one or more electrical measurement instruments electrically connected to the SMP connectors 606a-606c may be substantially 50Ω, electrical resistances of the dampening resistors 602a-602c may be substantially 15Ω, and electrical resistances of the parallel resistors 604a-604c may be substantially 120Ω. Accordingly, input impedances 612a-612c looking into each of the test input terminals 610a-610c may be substantially 50Ω. Also, effective measurement input impedances of the electrical measurement instruments connected to the SMP connectors 606a-606c may be reduced to substantially 35Ω. Accordingly, each of the channels of the DIMM test device 600 may be suitable for use in testing test signals to be applied to a DIMM having input impedances of substantially 50Ω and DIMM circuitry impedances of substantially 35Ω.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc.," or "one or more of A, B, and C, etc.," is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
   a test input terminal configured to electrically connect to a signal output terminal of a signal generator, the test input terminal configured to receive a test signal from the signal generator via the signal output terminal;
   a measurement output terminal to electrically connect to a measurement input terminal of an electrical measurement instrument;
   a reference voltage potential node; and
   a parallel resistor electrically connected from the measurement output terminal to the reference voltage potential node to reduce an effective measurement input impedance looking into the measurement input terminal of the electrical measurement instrument.

2. The apparatus of claim 1, further comprising a dampening resistor electrically connected from the test input terminal to the measurement output terminal.

3. The apparatus of claim 2, wherein a sum of an electrical resistance of the dampening resistor and a real component of a measurement input impedance looking into the measurement input terminal of the electrical measurement instrument is greater than a signal output impedance of the signal generator.

4. The apparatus of claim 3, wherein the electrical resistance of the dampening resistor is substantially fifteen ohms (15Ω) and the measurement input impedance looking into the measurement input terminal of the electrical measurement instrument is substantially fifty ohms (50Ω).

5. The apparatus of claim 2, wherein the input impedance looking into the test input terminal is substantially a series combination of an electrical resistance of the dampening resistor with the effective measurement input impedance looking into the measurement input terminal of the electrical measurement instrument.

6. The apparatus of claim 1, wherein an electrical resistance of the parallel resistor is substantially one hundred twenty ohms (120Ω).

7. The apparatus of claim 1, wherein the input impedance looking into the test input terminal is substantially equal to a signal output impedance looking into the signal output terminal of the signal generator.

8. The apparatus of claim 1, further comprising an electrical connector configured to detachably electrically connect the measurement output terminal to the measurement input terminal of the electrical measurement instrument.

9. The apparatus of claim 8, wherein the electrical connector includes a sub miniature push-on (SMP) connector.

10. The apparatus of claim 8, further comprising a reference voltage potential terminal, wherein the electrical connector is further configured to electrically connect the reference voltage potential terminal to a reference voltage potential input terminal of the electrical measurement instrument.

11. A system, comprising:
a device under test (DUT) including a DUT input terminal, DUT circuitry, and a dampening resistor electrically connected between the DUT input terminal and the DUT circuitry, the DUT input terminal having a DUT input impedance looking into the DUT input terminal; and
a test device including:
a test input terminal having an input impedance substantially equal to the DUT input impedance;
a measurement output terminal to electrically connect to a measurement input terminal of an electrical measurement instrument; and
a parallel resistor electrically connected in parallel with the electrical measurement instrument when the measurement input terminal of the electrical measurement instrument is electrically connected to the measurement output terminal of the test device, the parallel resistor selected to reduce an effective input impedance of the electrical measurement instrument to substantially equal to a DUT circuitry impedance of the DUT circuitry.

12. The system of claim 11, wherein the device under test includes a dual inline memory module (DIMM).

13. The system of claim 11, further comprising a signal generator configured to:
selectively electrically connect to the DUT input terminal of the DUT and the test input terminal of the test device; and
provide a test signal to the DUT input terminal and the test input terminal.

14. The system of claim 13, wherein the signal generator includes a bit error ratio tester (BERT).

15. The system of claim 11, further comprising the electrical measurement instrument, wherein the electrical measurement instrument includes an oscilloscope.

16. A method of testing a dual inline memory module (DIMM), the method comprising:
electrically connecting a measurement input terminal of an electrical measurement instrument to a measurement output terminal of a DIMM test device, different from the DIMM, the DIMM test device including a parallel resistor electrically connected from the measurement output terminal to a reference voltage potential node to reduce an effective measurement input impedance of the electrical measurement instrument;
electrically connecting a signal output terminal of a signal generator to a test input terminal of the DIMM test device;
providing a test signal from the signal output terminal of the signal generator to the test input terminal of the DIMM test device;
verifying the test signal using the electrical measurement instrument;
electrically disconnecting the signal output terminal of the signal generator from the test input terminal of the DIMM test device;
electrically connecting the signal output terminal of the signal generator to a device under test (DUT) input terminal of the DIMM;
providing the test signal from the signal output terminal of the signal generator to the DUT input terminal of the DIMM; and
testing operation of the DIMM responsive to the test signal.

17. The method of claim 16, wherein electrically connecting the measurement input terminal of the electrical measurement instrument to the measurement output terminal of the DIMM test device includes electrically connecting an oscilloscope to the measurement output terminal of the DIMM test device.

18. The method of claim 17, wherein electrically connecting the oscilloscope to the measurement output terminal of the DIMM test device includes directly electrically connecting the oscilloscope to the measurement output terminal of the DIMM test device without an intervening high impedance probe.

19. The method of claim 16, wherein electrically connecting the signal output terminal of the signal generator to the test input terminal of the DIMM test device includes electrically connecting a bit error ratio tester (BERT) to the test input terminal of the DIMM test device.

20. The method of claim 16, wherein testing operation of the DIMM comprises performing a stressed eye test on the DIMM.

* * * * *